United States Patent [19]

Machida

[11] 4,430,627
[45] Feb. 7, 1984

[54] AMPLITUDE CONTROLLED SINE WAVE OSCILLATOR

[76] Inventor: Kenji Machida, 3-3, Nishiogiminami 2, Suginami-ku, Tokyo 167, Japan

[21] Appl. No.: 212,086
[22] PCT Filed: Dec. 5, 1978
[86] PCT No.: PCT/JP78/00040
§ 371 Date: Jun. 3, 1980
§ 102(e) Date: Jun. 3, 1980
[87] PCT Pub. No.: WO80/01224
PCT Pub. Date: Jun. 12, 1980

[51] Int. Cl.³ .............................................. H03B 5/26
[52] U.S. Cl. .................................. 331/109; 331/140; 331/183
[58] Field of Search ............... 331/109, 135, 140, 183

[56] References Cited

U.S. PATENT DOCUMENTS 2,831,975  4/1958  Catherall ............................. 331/135
3,851,276  11/1974  Kaplan ............................. 331/183 X

FOREIGN PATENT DOCUMENTS 2929355  7/1979  Fed. Rep. of Germany ...... 331/109

OTHER PUBLICATIONS

Burwen, "Ultra Low Distortion Oscillator" EDN-/EEE, vol. 16, No. 11, Jun. 1, 1971, p. 45.

*Primary Examiner*—Siegfried H. Grimm
*Assistant Examiner*—Edward P. Westin
*Attorney, Agent, or Firm*—Frishauf, Holtz, Goodman & Woodward

[57] ABSTRACT

An amplitude control circuit of the invention includes a vector composition circuit (18) for composing a cosine-wave signal (e3) from a sine-wave signal (e1) and a control signal generation circuit (20) for providing a control signal (e4) from the sine- and cosine-wave signals (e1, e3) which the control signal (e4) has substantially no ripples. DC level of the control signal (e4) is varied proportional to the amplitude of the sine-wave signal (e1) regardless of the frequency of the sine-wave signal (e1). The amplitude of an amplification control circuit (12) is controlled by the control signal (e4) so that the amplitude of the oscillation output signal (e1) derived from the oscillation circuit (16) is constant.

12 Claims, 19 Drawing Figures

FIG. 8
FIG. 9
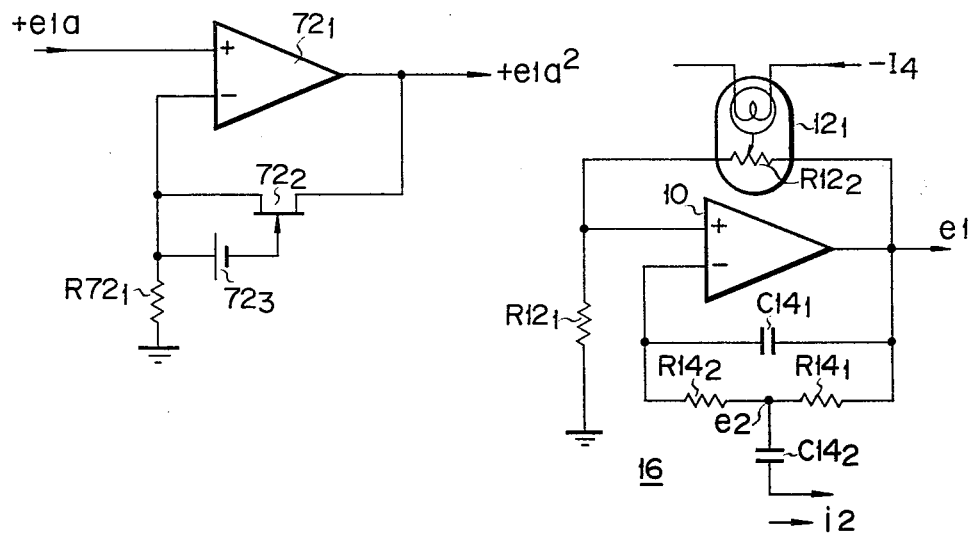
FIG. 10
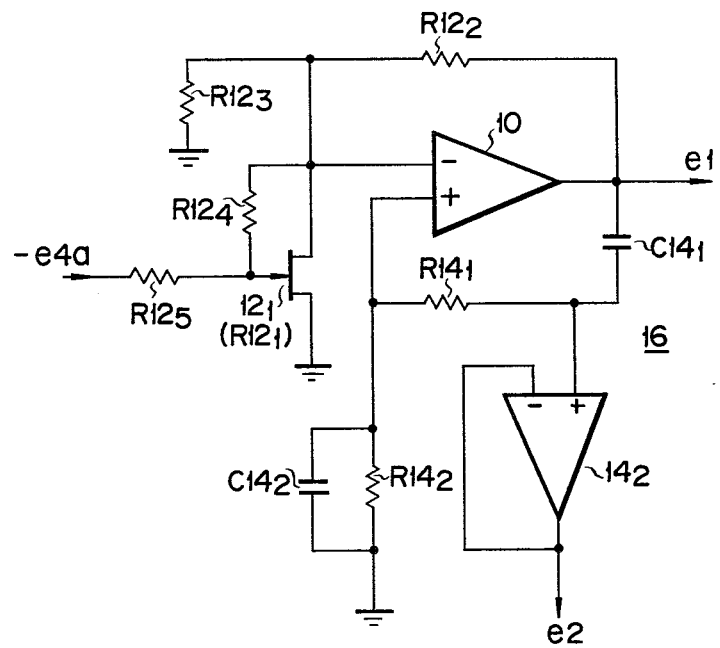

AMPLITUDE CONTROLLED SINE WAVE OSCILLATOR

RELEVANT ART

This invention relates to an amplitude control circuit for stabilizing the output signal amplitude of a sine-wave signal oscillator.

BACKGROUND OF THE INVENTION

For a sine-wave oscillator, especially an oscillator within a frequency range of a few Hz to a few hundreds KHz, Wien-bridge type or Sulzer type CR oscillator is generally used. Means for stabilizing the output signal amplitude often used are set forth as follows:

(a) By using a resistance variable element with Joule heat, such as a glass-tube enclosed type thermistor or a tungsten lamp.

(b) By using a resistance variable element with a control signal, such as an FET or a photo-cell type optical coupler.

The amplitude stabilizing means of the former (a) is popularly employed because of its simple construction. By means of (a), however, a low harmonics-distortion sine-wave signal below a few tens Hz is hardly obtained. Because the inner resistance of the amplitude stabilizing element is modulated by the amplitude change, not by the RMS (Root Mean Square) of the oscillation output signal amplitude. To solve this problem, an extremely large heat capacity is required for the amplitude stabilizing element. But a large heat capacity of the stabilizing element makes a trackability deteriorated, which the trackability means a response speed or a traceability for the average-variation of oscillation output amplitude. The deterioration of trackability will provide a fluctuation of the output amplitude, which is the so-called "hunting". The hunting phenomenon appears whenever the oscillation frequency is changed, and practically, this is very uncomfortable phenomenon. As mentioned above, matters to obtain a low harmonics-distortion and a little hunting at a low frequency range are contrary to each other.

The amplitude stabilizing means of the latter (b) is somewhat more complicated than the former (a) in consideration of the constructions or configurations. However, the amplitude stabilizing means of (b) is also often used. Because an amplitude stabilizing element for the (b) means is usually cheap device and hardly affected by surrounding temperature or mechanical vibration. In this means, the inner resistance of the amplitude stabilizing element is controlled by a control voltage or a control current. Suppose that we apply a source-drain resistance of FET to the amplitude stabilizing element. In this case the inner resistance of the FET is controlled by a gate-source voltage. Usually an average or peak level of rectified oscillation output signal is employed in the control voltage. Ripple components of the rectified oscillation output signal are eliminated through an eliminator or filter circuit.

In the case of the amplitude stabilizing means (b), when a low harmonics-distortion of oscillation output signal at low frequency range is required, a time constant of the filter circuit should also be set at large. Because an amplitude of ripple included in the control signal is enlarged with decrease of oscillation frequency, if the time constant is small. This ripple modulates the inner resistance of the amplitude stabilizing elements and makes the distortion factor of the oscillation output signal worsened. On the contrary a large time constant is applied to the filter circuit for lowering the distortion factor of oscillation output signal, said hunting phenomenon is in the forefront. Accordingly, even by the amplitude stabilizing means of (b), lowering the harmonics-distortion and avoiding the hunting phenomenon are the anti-requirement.

However, the art with the stabilizing means (b), which can solve the anti-requirement above-mentioned, i.e. provide a low harmonics-distortion and a little hunting, has been developed. To the best of inventor's knowledge, the most recent publication is "Transistor Technics" of October, 1978 published by CQ publishing company in Japan. In pages 283 to 300 of this publication a trial manufacture description of a sine-wave oscillator which may be solve said anti-requirement is disclosed. In the oscillator, a peak value of the oscillation output is sampled and held every cycle. When obtaining a control voltage by such a sample/hold circuit, after the holding state, ripples do not get mixed with the control voltage. However, in the case where the oscillation frequency is extremely low, I feel that the control voltage might be varied during sampling so as to distort the oscillation output. Accordingly, when an extremely low-frequency below a few Hz and low-distortion sine-wave signal is required without influence of said hunting phenomenon, the construction of the sample/hold circuit should, probably, be further devised or improved.

SUMMARY OF THE INVENTION

The object of this invention is to provide an amplitude control circuit suitable for a sine-wave oscillator, which can satisfy the anti-requirement of lowering a distortion factor and decreasing a hunting phenomenon.

To attain above object, an amplitude control circuit according to this invention includes an oscillator circuit which comprises:

an amplifier means to provide an oscillation output signal;

an amplification control means disposed in a first feedback loop of the amplifier means to control the amplification degree thereof; and an oscillation frequency setting means disposed in a second feedback loop to determine the frequency of the oscillation frequency output signal;

wherein the amplitude control circuit further includes:

a vector composition means for composing a first phase-shifted signal and a second phase-shifted signal, which the first phase-shifted signal has a phase difference from the oscillation output signal and is derived from the oscillation frequency setting means, and which the second phase-shifted signal has a predetermined phase difference from the oscillation output signal;

a control signal generation means to provide a control signal corresponding to an amplitude of the oscillation output signal in accordance with the second phase-shifted signal and the oscillation output signal, so that the amplitude of the oscillation output signal is kept constant.

According to the amplitude control circuit including above constructions, the control signal corresponding to the amplitude of the oscillation output signal, but substantially being independent of the oscillation frequency, can be obtained.

BRIEF DESCRIPTION OF THE DRAWINGS

FIG. 8 is an embodied circuit of the square-function circuit 72, 76 of FIG. 7;

FIGS. 9 to 11 show modifications of the oscillation circuit 16 of FIG. 2;

DESCRIPTION OF THE PREFERRED EMBODIMENTS OF THE INVENTION

Figure 1:
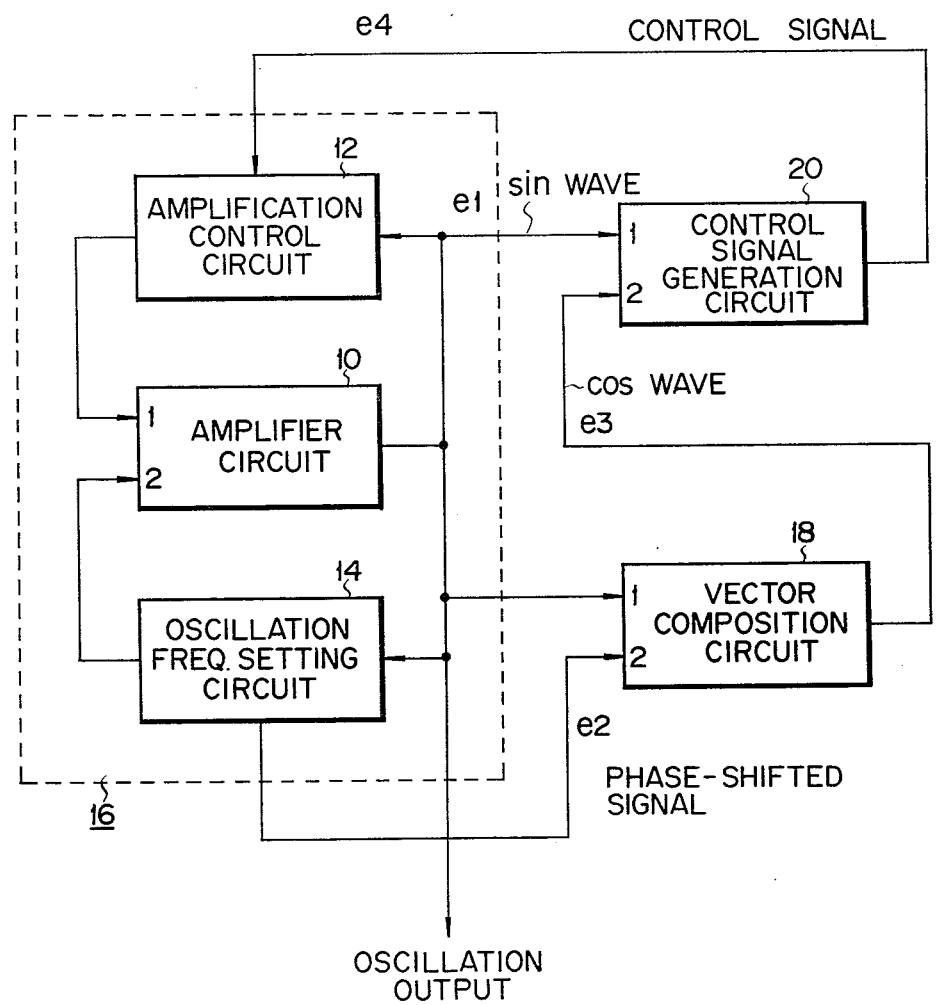
FIG. 1 is a block diagram showing a basic configuration of sine-wave oscillator which includes an amplitude control circuit according to the invention.

Now the preferred embodiments of the invention will be described below. In the description same or like portions are indicated by same or like reference numerals to avoid redundant explanation.

FIG. 1 shows a basic configuration of sine-wave oscillator which includes an amplitude control circuit according to the invention. An output signal e1 of an amplifier circuit 10 is input to an amplification control circuit 12. The signal e1 is positively (or negatively) fed back to a first input of the amplifier 10 through the control circuit 12. Also the signal e1 is negatively (or positively) fed back to a second input of the amplifier 10 via an oscillation frequency setting circuit 14. The circuit components 10, 12 and 14 constitute a conventional oscillation circuit 16. Suppose that the signals supplied to the first and second input of the amplifier 10 are, e.g., positive and negative feedback signals, respectively. In this case, the oscillation circuit 16 forms Sulzer type (Bridged T type) oscillator. On the contrary signals supplied to the first and second inputs are negative and positive feedback signals, the oscillation circuit 16 forms Wien-bridge type oscillator.

The signal e1 is supplied to a first input of a vector composition circuit 18. A second input of the composition circuit 18 is supplied with a phase-shifted signal e2 which is derived from the setting circuit 14. When Sulzer type or Wien-bridge type is applied to the setting circuit 14, a phase-shift amount about 45° of the signal e2 as against the signal e1 can be obtained. The signals e1 and e2 are converted into a signal e3 whose phase is shifted by 90° from the signal e1, by means of the composition circuit 18. For example, when the signal e1 is a sine-wave, the signal e3 is a cosine-wave. Also the signal e1 is supplied to a first input of a control signal generation circuit 20. A second input of the generation circuit 20 is supplied with the signal e3.

The control signal generation circuit 20 synthesizes a control signal e4 which includes a DC component proportioning to the sum of squared signals e1 and e3. That is, the DC component of the signal e4 can be explained by a function with parameter of $e1^2+e3^2$. Suppose that the signals e1 and e3 are defined as below:

$$e1 = E \sin \omega t \tag{1}$$

$$e2 = E \cos \omega t \tag{2}$$

wherein E denotes an amplitude (corresponding to the peak value) of each signals e1 and e3, $\omega$ an angular frequency and t a time. Then the signal e4 is expressed as $$e4 = k(e1^2 + e3^2) = kE^2(\sin^2\omega t + \cos^2 \omega t) \tag{3}$$
$$= kE^2$$

wherein k denotes a proportion constant which is a property of the generation circuit 20. Clearly anticipated from the equation (3), the signal e4 is independent of the angular frequency $\omega$ of the oscillation output signal e1. The signal e4 only contains information proportional to the square of amplitude E of the signal e1. By the signal e4 the transfer function of the control circuit 12 is controlled.

Figure 2:
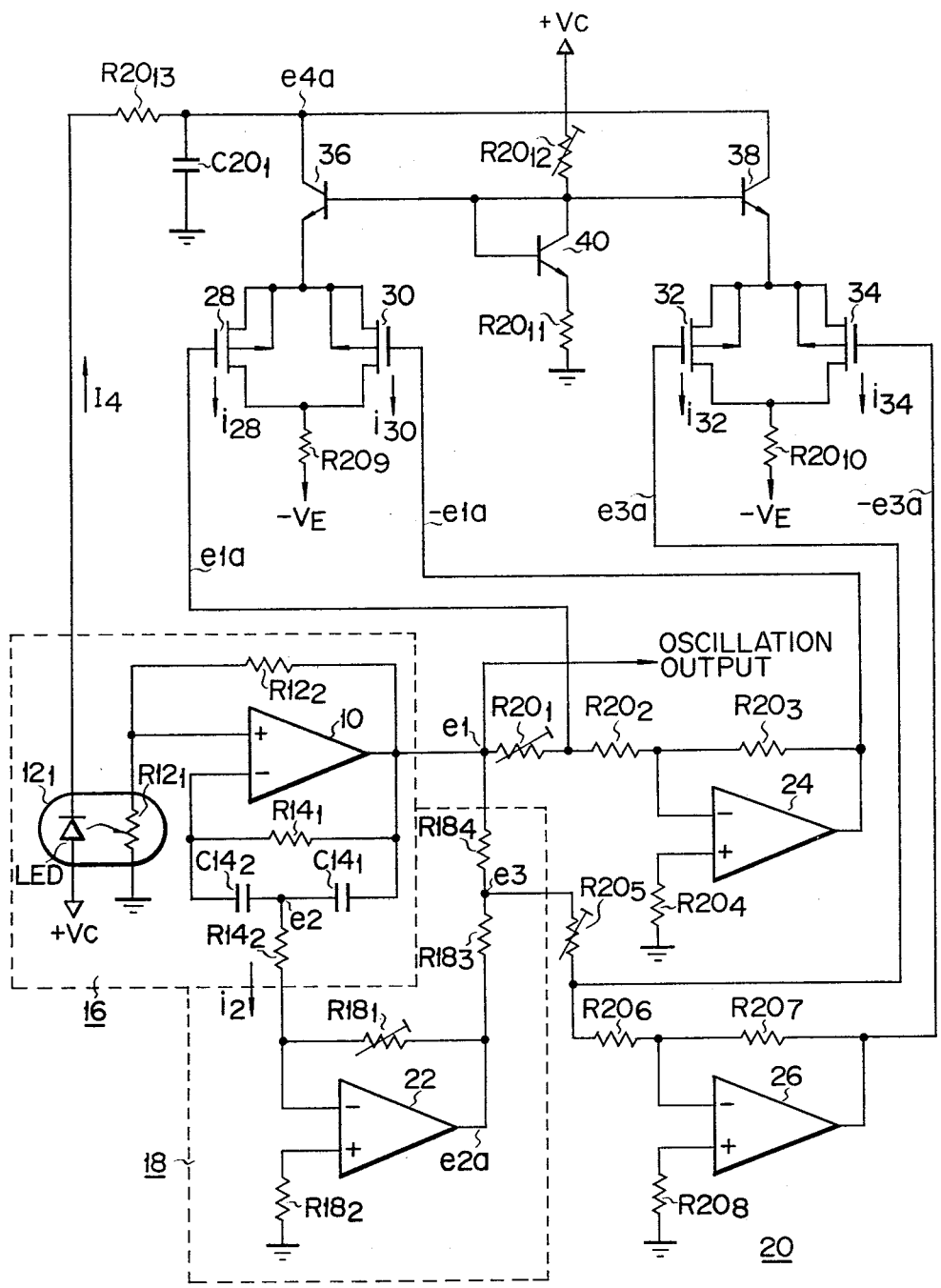
FIG. 2 is a circuit diagram showing an embodiment of FIG. 1.

FIG. 2 is a detail circuit diagram of the basic configuration shown in FIG. 1. The inventor believes that this circuit configuration is a best mode at the time the application is filed.

An output of an amplifier 10 is connected via a resistor $R12_2$ to a non-inverted input of the amplifier 10. The non-inverted input is grounded through a resistance $R12_1$ of an impedance controlled element $12_1$. For the element $12_1$ a photo-coupler combining LED and CdS cell is preferably applied. The element $12_1$ and the resistor $R12_2$ form the amplification control circuit 12. An inverted input of the amplifier 10 is connected to the output thereof, through a resistor $R14_1$. A series circuit of capacitors $C14_1$ and $C14_2$ is parallel connected to the resistor $R14_1$. The connection point of capacitors $C14_1$ and $C14_2$ is connected via a resistor $R14_2$ to an inverted input of an amplifier 22. The resistors $R14_1$, $R14_2$ and the capacitors $C14_1$, $C14_2$ form the oscillation frequency setting circuit 14 of Bridged T type. The amplifier 10, impedance controlled element $12_1$, resistors $R12_2$, $R14_1$, $R14_2$ and capacitors $C14_1$, $C14_2$ constitute the oscillation circuit 16.

The inverted input of the amplifier 22 is connected to an output thereof via a resistor $R18_1$. A non-inverted input of the amplifier 22 is grounded through a resistor $R18_2$. The resistor $R18_2$ is provided for an off-set balancing. The output of the amplifier 22 is connected to the output of the amplifier 10 through a series circuit of resistors $R18_3$ and $R18_4$. The amplifier 22 and the resistors $R18_1$ to $R18_4$ form the vector composition circuit 18. The inverted input of the amplifier 22 is in the state of "imaginary ground". That is, the junction point of the resistors $R14_2$ and $R18_1$ is equivalently grounded. At the connection point of the capacitors $C14_1$ and $C14_2$ in the oscillation frequency setting circuit 14, the phase-shifted signal e2 appears. The phase-shifted signal e2 is a sine-wave voltage signal having a phase difference $\phi$ from the sine-wave oscillation output signal e1 of the oscillation circuit 16. The signal e2 is converted to a current signal i2 corresponding to $e2/R14_2$ and input to the vector composition circuit 18. The current signal $i_2$ is converted into a phase-shifted signal e2a by the amplifier 22. The phase-shifted signal e2a is antiphased from the signal e2. An amplitude of the signal $e2_1$ can be varied by the resistor $R18_1$. The phase-shifted signal e2a and the oscillation output signal e1 are added by an adder circuit being formed of the resistors $R18_3$ and $R18_4$. By this addition a phase-shifted signal e3 whose phase is differenced by 90° from the signal e1, is obtained.

Figure 3A:
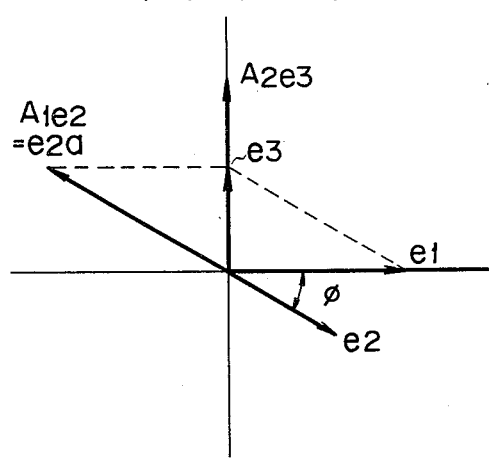
FIGS. 3A and 3B are vector diagrams useful for explaining a vector-composition by the vector composition circuit 18 of FIG. 1.

Reference should be made to FIG. 3A. This figure illustrates how the composition of the phase-shifted signal e3 is performed in the vector composition circuit 18. Now we suppose that the phase-shifted signal e2 is phase-delayed by $\phi$ from the oscillation output signal e1. To invert the phase of the signal e2 and amplify its amplitude by $A_1$, the phase-shifted signal e2a is obtained. By vector-summing the signal e2a and the signal e1 a phase-shifted signal e3 is composed. The phase difference between the signal e1 and the signal e3 can be set at 90° by adjusting the amplitude rate $A_1$. Namely, the vector composition circuit 18 composes a cosine-wave signal from a sine-wave signal. A 90° phase-shifted signal $A_2e3$ whose amplitude is equal to the oscillation output signal e1, is obtained from amplifying the signal e3 by $A_2$.

Reference should return to FIG. 2 the output of the amplifier 10 is connected to an inverted input of an amplifier 24, through a series circuit of resistors $R20_1$ and $R20_2$. The inverted input of the amplifier 24 is coupled with its output via a resistor $R20_3$. A non-inverted input of the amplifier 24 is grounded by way of a resistor $R20_4$ for off-set balancing. The junction point of the resistors $R18_3$ and $R18_4$ is connected to an inverted input of an amplifier 26, through a series circuit of resistors $R20_5$ and $R20_6$. The inverted input of the amplifier 26 is coupled with its output via a resistor $R20_7$. A non-inverted input of the amplifier 26 is grounded by way of a resistor $R20_8$.

Figure 4A:
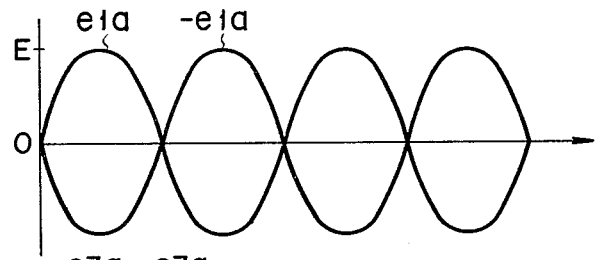
FIGS. 4A to 4C show waveforms of sine-waves $\pm e1a$, cosine-waves $\pm e3a$ and a control signal $e4a$ indicated in the circuit of FIG. 2.
Figure 4B:
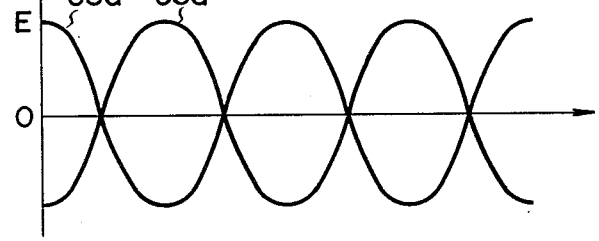

In the circuit configuration above-mentioned, suppose that $R20_2 = R20_3$ and $R20_6 = R20_7$. In this case, when a signal appeared at the junction point of the resistors $R20_1$ and $R20_2$ is deemed as e1a, a signal appeared at the output of the amplifier 24 is $-e1a$. Similarly, a signal at the junction point of the resistors $R20_5$ and $R20_6$ as e3a, a signal at the output of the amplifier 26 as $-e3a$. The signal e1a is in-phase with the oscillation output signal e1 and the signal e3a is in-phase with the phase-shifted signal e3. Accordingly a phase difference of 90° is presented between the signals e1a and e3a. Amplitudes of the signals e1a and e3a can be adjusted by the resistors $R20_1$ and $R20_5$, respectively. The amplitudes of signals e1a and e3a can therefore be set to equal each other. The phase relations of the signals e1a, $-e1a$ and the signals e3a, $-e3a$ are respectively shown in FIGS. 4A and 4B.

Figure 5:
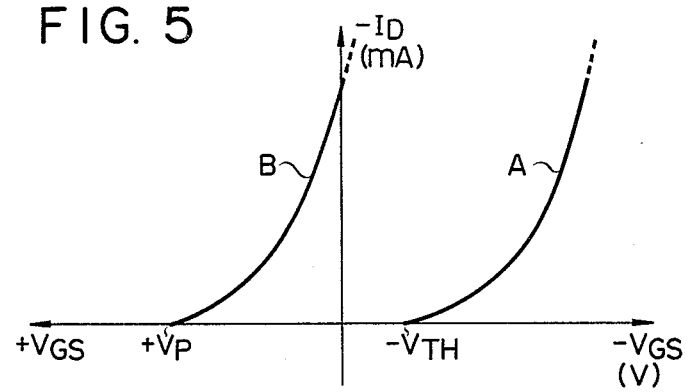
FIG. 5 is a graph showing an example of a gate voltage-drain current characteristic of P channel FETs 28 to 34 shown in FIG. 2.

Reference should be made to FIG. 2, again. The junction point of the resistors $R20_1$ and $R20_2$ is connected to the gate of a P channel MOS FET 28. The output of the amplifier 24 is connected to the gate of a P channel MOS FET 30. Similarly, the junction point of $R20_5$ and $R20_6$ and the output of the amplifier 26 are connected to the gates of P channel MOS FETs 32 and 34, respectively. In this circuit an enhancement type is used for the FETs 28 to 34. However, any type of device may be used whose characteristic of drain current $I_D$ can substantially be represented by a square-function of its gate-source voltage $V_{GS}$. For example, a depletion type may be applied to FETs 28 to 34. The chief reason for applying an enhancement type FETs in FIG. 2 is that the circuit configuration can easily be simplified. FIG. 5 shows a typical $I_D$-$V_{GS}$ characteristic of P channel FET. In this figure, a curve "A" indicates an enhancement type and $-V_{TH}$ designates its threshold voltage. A curve "B" indicates a depletion type and $+V_p$ designates its pinch-off voltage. Generally the curves "A", "B" can be represent by a square-function with good accuracy.

In FIG. 2, the drains of FETs 28 and 30 are connected through a resistor $R20_9$ to a negative power source $-V_E$. The drains of FETs 32 and 34 are connected to the power source $-V_E$ via a resistor $R20_{10}$. The resistors $R20_9$ and $R20_{10}$ is used for over-current limiter. Each substrate and source of FETs 28 and 30 is connected to the emitter of an NPN transistor 36. Also, each substrate and source of FETs 32 and 34 is connected to the emitter of an NPN transistor 38. The bases of the transistors 36 and 38 are connected to the base and collector of an NPN transistor 40. The emitter of the transistor 40 is grounded through a resistor $R20_{11}$. The collector of the transistor 40 is connected to a positive power source $+V_C$ via a resistor $R20_{12}$. The diode-connected transistor 40 is provided for temperature-compensation of the base-emitter threshold voltages $V_{BE}$ of the transistors 36 and 38. Gate bias voltages $V_{SG}$ for the FETs 28 to 34 can be adjusted by the resistor $R20_{12}$. In this circuit, "dual" type, in which electrical characteristics of packed pellets are matched, are suitable for the FETs 28 and 30, also for the FETs 32 and 34.

The collectors of the transistors 36 and 38 are connected through a resistor $R20_{13}$ to the cathode of an LED or light emission device which is coupled with the impedance controlled element $12_1$. The anode of the LED is connected to the positive power source $+V_C$. The collectors of the transistors 36 and 38 are grounded, via a capacitor $C20_1$. The capacitor $C20_1$ is provided for decreasing remaining ripples included in a control current $I_4$ or in a control voltage e4 which is applied to the amplification control circuit 12. If the $I_D$-$V_{GS}$ characteristics of the FETs 28 to 34 may completely be regarded as a square function, the control current $I_4$ does not involve the ripples. However, where the $I_D$-$V_{GS}$ characteristics do not meet at the square function the current $I_4$ includes some ripples. Frequency components of the ripple are higher harmonics over second order of the oscillation output signal e1's frequency. Moreover the amplitude of the ripple component is extremely small as compared with the DC level of the control current $I_4$. The time constant may therefore be small, which is formed of the capacitor $C20_1$ and the corrector circuit impedance of the transistors 36 and 38. When the accuracy of the square-function characteristics are adequate, or there is no requirement to the oscillation output signal e1 whose distortion factor should be extremely low, the capacitor $C20_1$ may be deleted.

The amplifiers 24 and 26, FETs 28 to 34, transistors 36 to 40, resistors $R20_1$ to $R20_{13}$ and the capacitor $C20_1$ are constituting the control signal generation circuit 20.

The composing operation of the control current $I_4$, i.e. the control signal e4 as set forth in equation (3), can be explained as described below. This explanation will be made by referring FIGS. 4 and 5. Suppose that, in FIG. 2, the source-potentials of FETs 28 to 34 are adjusted at the threshold voltage $+V_{TH}$. This means that the gate voltage $-V_{GS}$ to the sources of FETs 28, 30 or FETs 32, 34 are $-V_{TH}$ at the time of zero-amplitude of the signal e1a or e3a. In this case, the FET 28 is cutoff during the positive half period of the signal e1a. While the negative half period of the signal e1a, a current $i_{28}$ proportional to $e1a^2$ is flowing into the source-drain path of FET 28. Similarly, only the negative half period of the signal $-e1a$ or the positive half period of the signal e1a, a current $i_{30}$ proportional to $(-e1a)^2$ is flowing into the FET 30. Then a current $i_{28}+i_{30}$ proportional to $e1a^2$ flows in the collector circuit of the transistor 36 along the whole phase.

Figure 4C:
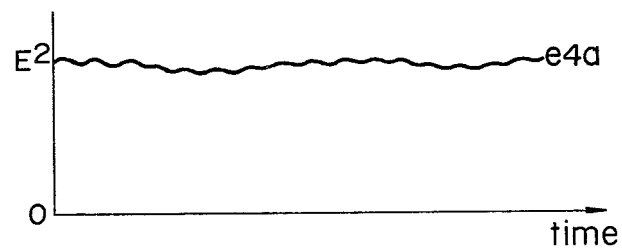

In the same way, a current $i_{32}$ proportional to $e3a^2$ and a current $i_{34}$ to $(-e3a)^2$ are flowing into the FETs 32 and 34, respectively. Then a current $i_{32}+i_{34}$ proportional to $e3a^2$ flows in the collector circuit of the transistor 38 along the whole phase. The sum of the currents $i_{28}$, $i_{30}$, $i_{32}$ and $i_{34}$ provides the control current $I_4$. A collector voltage e4a of the transistors 36 and 38 corresponding to the control current $I_4$ is a DC signal including some ripples, as shown in FIG. 4C. The ripples will appear when said square-function characteristics can not precisely be obtained. The level of the DC signal is proportional to the square of the amplitude of oscillation output signal e1, but has no relation to the oscillation frequency. The control current $I_4$ also has a waveform as shown in FIG. 4C. By using such control current $I_4$, a CR oscillator with low-distortion and low-hunting can be provided.

By applying the amplitude control circuit of this invention, a stable oscillation output signal can be obtained irrespective of its oscillation frequency. Accordingly, an extreme low frequency sine-wave signal, which has only been put to practical use by a function generator, can be obtained by a conventional Sulzer type or Wien-bridge type oscillator circuit with this invention.

Hitherto a function generator is widely used for an extreme low frequency band sine-wave oscillator. In the function generator a sine-wave is composed from a triangle-wave by functional conversion of $f(x)=\sin x/x$. Accurate conversion of this function is difficult, technically. It is therefore hard to obtain a low distortion sine-wave from a triangle-wave. Further, a sine-wave obtained from this functional conversion is attended with a large distortion including much higher harmonics of odd number order. On the contrary, by the configuration of FIG. 2, an extremely low frequency sine-wave signal e1 with low distortion factor can be obtained.

Figure 6:
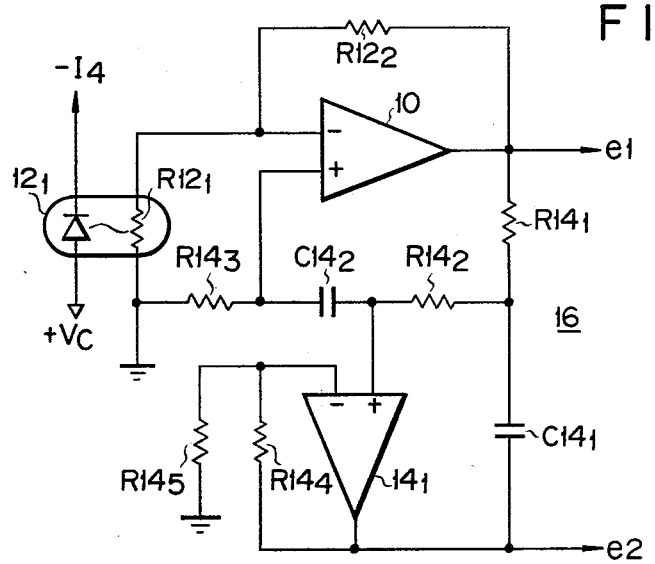
FIG. 6 is a modification of the oscillation circuit 16 shown in FIG. 2.

FIG. 6 shows a modification of oscillation circuit 16 applicable to this invention. In this circuit a bootstrap type positive feedback circuit is applied to the oscillation frequency setting circuit 14. This positive feedback circuit is one modification of another Japanese Patent Application "BAND REJECTION CIRCUIT" which is made by the same inventor. This application is Japanese Patent Application No. 145981/76 filed on Dec. 4, 1976 and is amended on Aug. 23, 1977.

A positive feedback circuit of the amplifier 10 or the amplification control circuit 12 has the same configuration of FIG. 2. On the other hand the negative feedback circuit is constructed as below. The output of the amplifier 10 is connected to a non-inverted input of an amplifier $14_1$, via a series circuit of resistors $R14_1$ and $R14_2$. The junction point of the resistors $R14_1$ and $R14_2$ is connected through a capacitor $C14_1$ to an output of the amplifier $14_1$. The output of the amplifier $14_1$ is connected through a resistor $R14_4$ to an inverted input thereof. The inverted input of the amplifier $14_1$ is grounded via a resistor $R14_5$. The non-inverted input of the amplifier $14_1$ is connected through a capacitor $C14_2$ to the non-inverted input of the amplifier 10. The non-inverted input of the amplifier 10 is grounded via a resistor $R14_3$.

In this circuit, when an amplitude $A_{14}$ of the amplifier $14_1$ is "1", or $R14_4/R14_5=0$, the oscillation frequency can be varied by the capacitors $C14_1$ and/or $C14_2$. It is undesirable to use the resistors $R14_1$ and/or $R14_2$ for varying the oscillation frequency, when $A_{14}=1$. If the resistor $R14_1$ or $R14_2$ is varied, the negative feedback amount of the amplifier 10 at the oscillation frequency is also varied in accordance with the variance of the resistor. This makes the amplitude of the oscillation output signal e1 changed. In the extreme case, the output signal e1 may be clipped or the oscillation be stopped. However, when the resistors $R14_1$, $R14_2$ and $R14_3$ is so varied as to hold the relation "$(R14_1+R14_2)/R14_3=$constant", no problem will occur.

Suppose that the following relation is held.

$$A_{14}=R14_4/R14_5+1=C14_2/C14_1+1 \tag{4}$$

Arranging the relation (4), $$R14_4 C14_1 = R14_5 C14_2 \tag{5}$$

is obtained.

When the relation (4) or (5) is held, if the oscillation frequency is varied by $R14_1$, no amplitude variation is occurred in the oscillation output signal e1. In the case where $A_{14}=2$ and $C14_1=C14_2$, for example, the relation (4) or (5) is satisfied. In this case, the transfer function at the oscillation frequency from the output of the amplifier 10 to the non-inverted input thereof, is independent of the resistor $R14_1$. Thus, the oscillation frequency may be varied by changing the resistor $R14_1$. Detail description relating to the theoretical analysis of the relations mentioned above is set forth on the amended specification of said Japanese Patent Application No. 145981/76.

In the oscillation circuit 16 of FIG. 6, there is an advantage that a device (resistor or capacitor) for varying the oscillation frequency may be single. This means that such a circuit is particularly suitable to constitute a voltage controlled oscillator (VCO). On the other hand, in an oscillation circuit of Sulzer or Wien-bridge type, at least a two-ganged or more ganged type variable resistor or variable capacitor (variable condenser) is required for varying the oscillation frequency, and when such a ganged device includes a gang-error the amplitude of the oscillation output e1 is liable to vary with varying the oscillation frequency.

Figure 7:
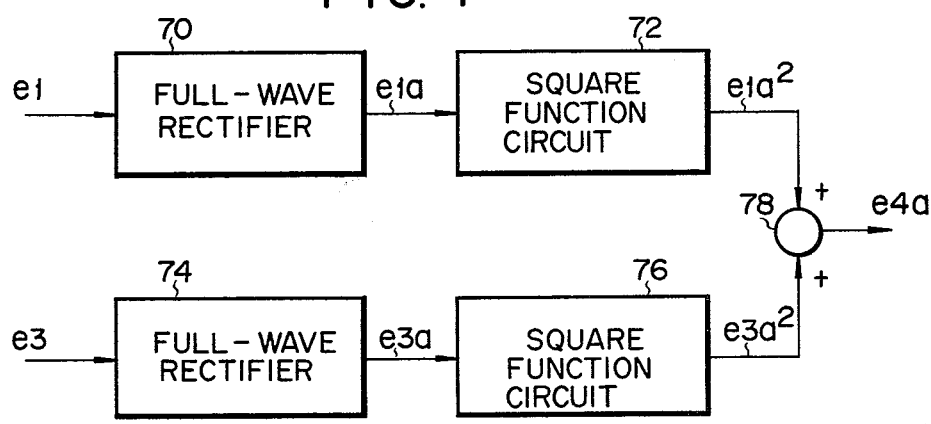
FIG. 7 is a block diagram showing a modification of the square-function composing circuit included in the control signal generation circuit 20 of FIG. 2.

FIG. 7 shows a modification of the square function composition circuit in the control signal generation circuit 20. In the case of FIG. 2 a square function characteristic between the gate-source voltage $V_{GS}$ and the drain current $I_D$ of FETs 28~34 is applied. Further, a full-wave rectification for the signals e1 and e3 is realized by the FETs 28 to 34 such that these FETs are cut-off during the positive half period of ±e1 and ±e3. Such a full-wave rectification and square function composition of the FETs 28 to 34 may be realized by a general configuration as shown in FIG. 7. In this configuration the signal e1 is converted to, for example, a pulsation signal e1a of positive period of sine-wave by a full-wave rectifier 70. The signal e1a is converted to a squared signal $e1a^2$ by a square function circuit 72. Similarly the signal e3 is converted to a squared signal $e3a^2$ through a full-wave rectifier 74 and a square function circuit 76. The squared signals $e1a^2$ and $e3a^2$ is added by an adder 78. Then the adder 78 provides the squared signal $e4a = e1a^2 + e3a^2$.

The full-wave rectifiers 70, 74 and the square function circuit 72, 76 and the adder 78 may be conventional ones. For the rectifier 70 or 74 a linear rectifier circuit, which comprises an operational amplifier whose negative feedback loop includes a rectifying diode or a rectifying transistor, is suitable. For the square function circuit 72 or 76, following circuit means is suitable.

(a) By means of a tangential approximation using diodes.

(b) By means of a combination of log-compressor, doubler amplifier and exponential function circuit. For example, an input signal e1 is converted through the log-compressor to log e1. This log e1 is doubled by the doubler amplifier and is converted to $2 \log e1 = \log e1^2$. This $\log e1^2$ is converted to exp $(\log e1^2) = e1^2$, via the exponential function circuit.

(c) By means of an application of $\sqrt{\ }$ type (root or radical type) voltage-current characteristic which appears in a low voltage range of a drain current and drain-source voltage property of an FET. A circuit example of such means is shown in FIG. 8.

An output of an amplifier $72_1$ is connected to the drain of an N channel depletion type FET $72_2$. The source of the FET $72_2$ is connected to an inverted input of the amplifier $72_1$. The inverted input is grounded via a resistor $R72_1$. Connected between the source and gate of the FET is a gate-bias voltage source $72_3$. The curve of the drain current and source-drain voltage of the FET $72_2$ can be varied by changing the voltage of the source $72_3$. When a positive potential signal e1a with a given amplitude is input to a non-inverted input of the amplifier $72_1$, a signal nearly proportional to $e1a^2$ is obtained from the output of the amplifier $72_1$.

FIGS. 9 through 12 show modifications of the oscillation circuit 16 shown in FIG. 2. In FIG. 9 a resistor $R12_2$ within an impedance controlled element $12_1$ included in the amplification control circuit 12 is connected between the non-inverted input and output of an amplifier 10. When the amplitude of the oscillation output signal e1 is increased, a current $I_4$ supplied to a lamp included in the element $12_1$ is decreased. In this figure the decrease of the current $I_4$ is indicated by $-I_4$ which marked with a negative sign. With decrease of the current $I_4$, the resistance value of the resistor $R12_2$ is increased, then the amplitude of the signal e1 is decreased. Further, for the oscillation frequency setting circuit 14, a capacitor $C14_1$ is used as a bridging element, and the supplement of said oscillation circuit current $i_2$ is carried out through a capacitor $C14_2$.

In FIG. 10, a Wien-bridge type oscillation circuit is employed for the oscillation circuit 16. The output of an amplifier 10 is connected through a resistor $R12_2$ to the inverted input thereof. The inverted input of the amplifier 10 is grounded, via a resistor $R12_3$ and the drain-source path of an N channel FET $12_1$. For this FET $12_1$ a depletion type is considered. When an enhancement type or P channel type FET is used for the FET $12_1$, a biasing method or a polarity of the control signal e4a should be changed. Connected between the drain-gate path of the FET $12_1$ is a resistor $R12_4$. The resistor $R12_4$ is employed in a negative feedback to compensate the non-linearity of the inner resistance ($R12_1$) of the FET $12_1$. By the negative feedback operation, drain voltage-drain current characteristic of the FET $12_1$ displays a non-saturation curve which is so-called "triode characteristic". When such a negative feedback is used, substituting a bipolar transistor for the FET $12_1$ may be done. Even though by employing a bipolar transistor $12_1$, said triode characteristic can apparently be obtained. To the gate of the FET $12_1$ a control signal e4a is applied through a resistor $R12_5$. In FIG. 10 the control signal e4a is makred with negative sign. This negative sign denotes that the amplitude increment of the oscillation output signal e1 makes the potential of the control signal e4a lowered. That is, the negative control signal $-e4a$ is proportional to the amplitude of the oscillation output signal e1.

Figure 3B:
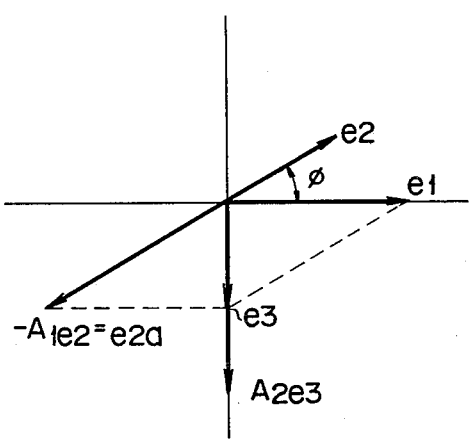

The output of the amplifier 10 is connected to the non-inverted input thereof, via a series circuit of a capacitor $C14_1$ and a resistor $R14_1$. The non-inverted input of the amplifier 10 is grounded through a parallel circuit of a resistor $R14_2$ and a capacitor $C14_2$. The junction point of the resistor $R14_1$ and the capacitor $C14_1$ is connected to a non-inverted input of an amplifier $14_2$. An inverted input of the amplifier $14_2$ is connected to an output thereof. The phase-shifted signal e2 is derived from the output of the amplifier $14_2$. The amplifier $14_2$ is merely provided for an impedance converter. In the oscillation circuit 16 of FIG. 10, the phase-shifted direction of the signal e2 is opposite to that of FIG. 2. In this case the composition of a 90° phase-shifted signal e3 is performed as shown in FIG. 3B.

Figure 11:
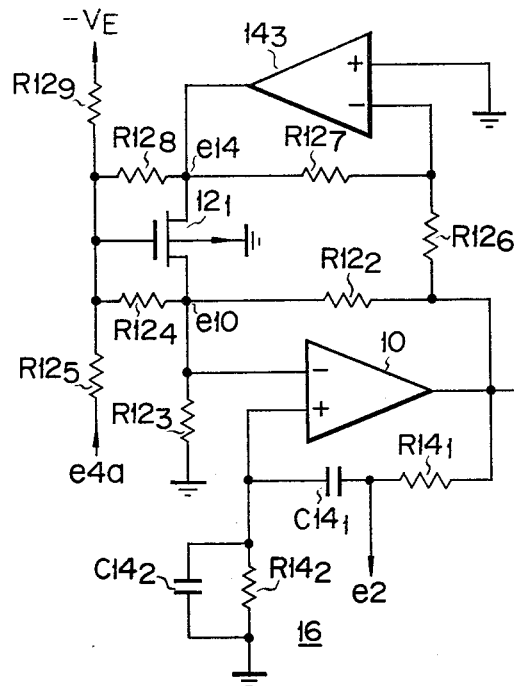

FIG. 11 shows a modification of the oscillation circuit 16 shown in FIG. 10. The output of the amplifier 10 is connected to the non-inverted input thereof, through a series circuit of a resistor $R14_1$ and a capacitor $C14_1$. The non-inverted input of the amplifier 10 is grounded, via a parallel circuit of a resistor $R14_2$ and a capacitor $C14_2$. The output of the amplifier 10 is connected through a resistor $R12_2$ to the inverted input thereof. The inverted input of the amplifier 10 is grounded via a resistor $R12_3$. The output of the amplifier 10 is connected through a resistor $R12_6$ to an inverted input of an amplifier $14_3$. The inverted input of the amplifier $14_3$ is connected to an output thereof via a resistor $R12_7$. A non-inverted input of the amplifier $14_3$ is grounded.

Connected between the inverted input of amplifier 10 and the output of amplifier $14_3$ is the drain-source path of an enhancement type P channel MOS-FET $12_1$. The substrate of the FET $12_1$ is grounded. The gate of the FET $12_1$ is connected through a resistor $R12_4$ to the drain (or source) thereof. The gate is also connected to the source (or drain) via a resistor $R12_8$. To the gate of the FET $12_1$ the control signal e4a is supplied through a resistor $R12_5$. The gate is connected through a resistor $R12_9$ to a negative power source $-V_E$ for biasing the FET $12_1$. The phase-shifted signal e2 is derived from the junction point of the resistor $R14_1$ and the capacitor $C14_1$.

In the oscillation circuit 16 of FIG. 11, suppose that the drain-source structure of the FET $12_1$ is symmetrical with respect to the gate and $R12_4 = R12_8$, and that the amplitude of a signal e10 at the inverted input of the amplifier 10 is same as that of a signal e14 at the output of the amplifier $14_3$ by adjusting the value of a resistance ratio $R12_7/R12_6$. Then, the drain and source of the FET $12_1$ are applied with the signals e10 and e14 which have the same amplitude and antiphase relation with each other with respect to the substrate potential. Thus, the FET $12_1$ is driven in a condition of "Push-Pull". Such configuration is well fitted for amplitude-controlling of a large amplitude signal. The resistors $R12_4$ and $R12_8$ is used for compensating the non-linearity of inner resistance of the FET $12_1$. However, an oscillation output signal e1 with relatively low distortion can be obtained without using the resistors $R12_4$ and $R12_8$ when the amplitude of a signal applied to the FET $12_1$ is small. By fine-adjusting the amount of a resistance ratio $R12_7/R12_6$, a minimum point of distortion of the oscillation output signal e1 can be attained.

Figure 12:
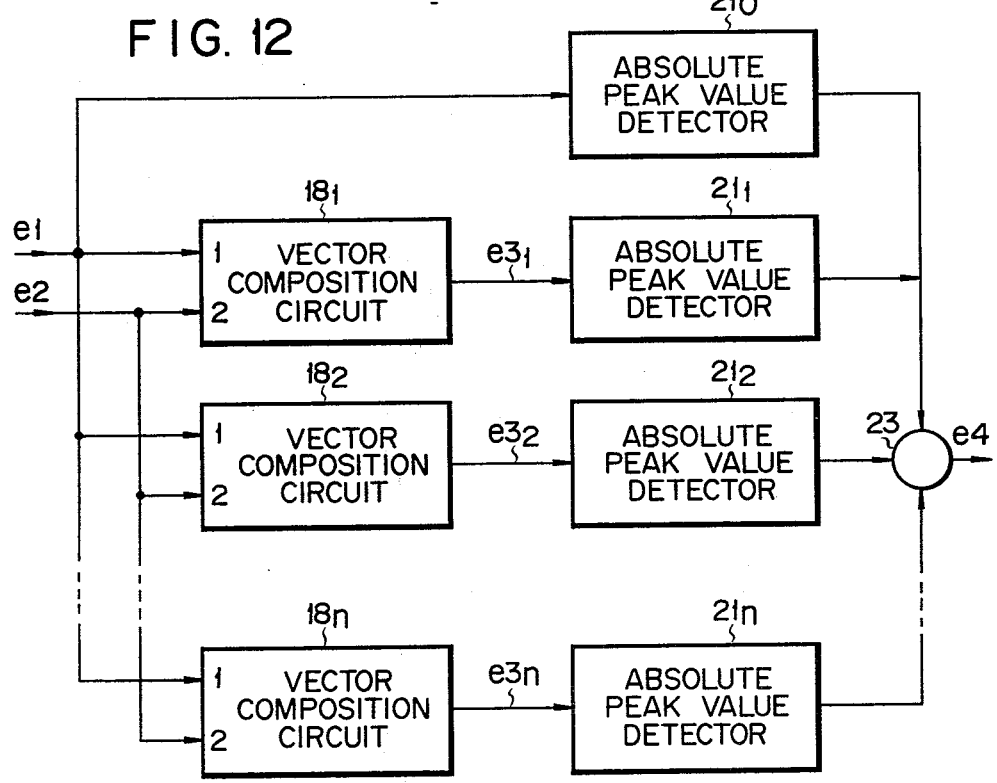
FIG. 12 is a block diagram which shows modified configuration of the vector composition circuit 18 and the control signal generation circuit 20 of FIG. 1.

FIG. 12 shows a modification of the basic configuration of FIG. 1. In FIG. 1, a signal $e2 = \sin(\omega t - \phi)$ is converted to $e3 = \cos \omega t$ by the vector composition circuit 18, and a control signal $e4 = e1^2 + e3^2$, which does substantially not include ripples, is obtained from the control signal generation circuit 20. On the contrary, in FIG. 12, "n" kinds of phase-shifted signals $e3n$ are composed by "n" blocks of vector composition circuits $18n$. The control signal e4 is obtained from summing the absolute peak values of these signals $e3n$. Thus, FIG. 12 shows a configuration embodying the following equation:

$$e4 = \sum_{i=0}^{n} [e3_i] = \sum_{i=0}^{n} [E \sin(\omega t - \phi_i)] \quad (6)$$

In the equation (6), when $i=0$, or $e3_0 = E \sin(\omega t - \phi_0)$, this directly corresponds to the oscillation output. The bracket "[ ]" denotes the peak absolute value.

The oscillation output signal e1 is applied to an absolute peak value detector $21_0$ and the first input of vector composition circuits $18_1$ to $18n$. The circuits $18_1$ to $18n$ compose phase-shifted signals $e3_1$ to $e3n$ based on the signals e1 and e2. Each of the composition circuits $18_1$ to $18n$ may has the same configuration as that of the composition circuit 18 shown in FIG. 2. Signals $e3_1$ to $e3n$ composed by the circuits $18_1$ to $18n$, respectively, are input to absolute peak value detectors $21_1$ to $21n$. The signals $e3_1$ to $e3n$ are converted to absolute peak value signals $|e1|$ and $|e3_1|$ to $|e3n|$, respectively. These signals are added by an adder 23.

Figure 13:
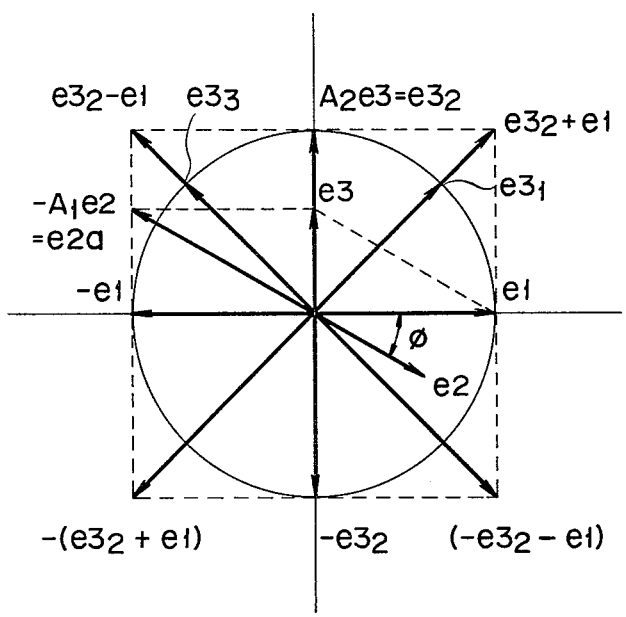
FIG. 13 shows a vector diagram of signals produced in the blocks of FIG. 12.

FIG. 13 shows an example of vector diagram wherein "n=3" is applied to the equation (6). In this example, phase differences of the signals e1, $e3_1$, $e3_2$ and $e3_3$ are 45°. If the phase-shift amount of the phase-shifted signal e2 is originally 45°, the vector composition at the time of n=3 can easily be accomplished.

Figure 14:
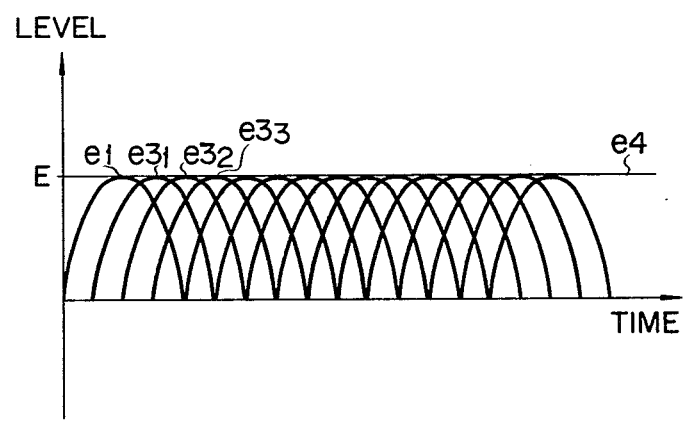
FIG. 14 shows a waveform diagram indicating how a control signal e4 is obtained at the condition "n=3" of FIG. 12 configuration.

FIG. 14 shows an envelope of the control signal e4 which is composed in the case of n=3. Ripples of the peak of the signals e1, $e3_1$, $e3_2$ and $e3_3$ applied to the adder 23 are small. The time constants of charge-discharge circuits of the detectors $21_0$ to $21_3$ may therefore be relatively small.

Figure 15:
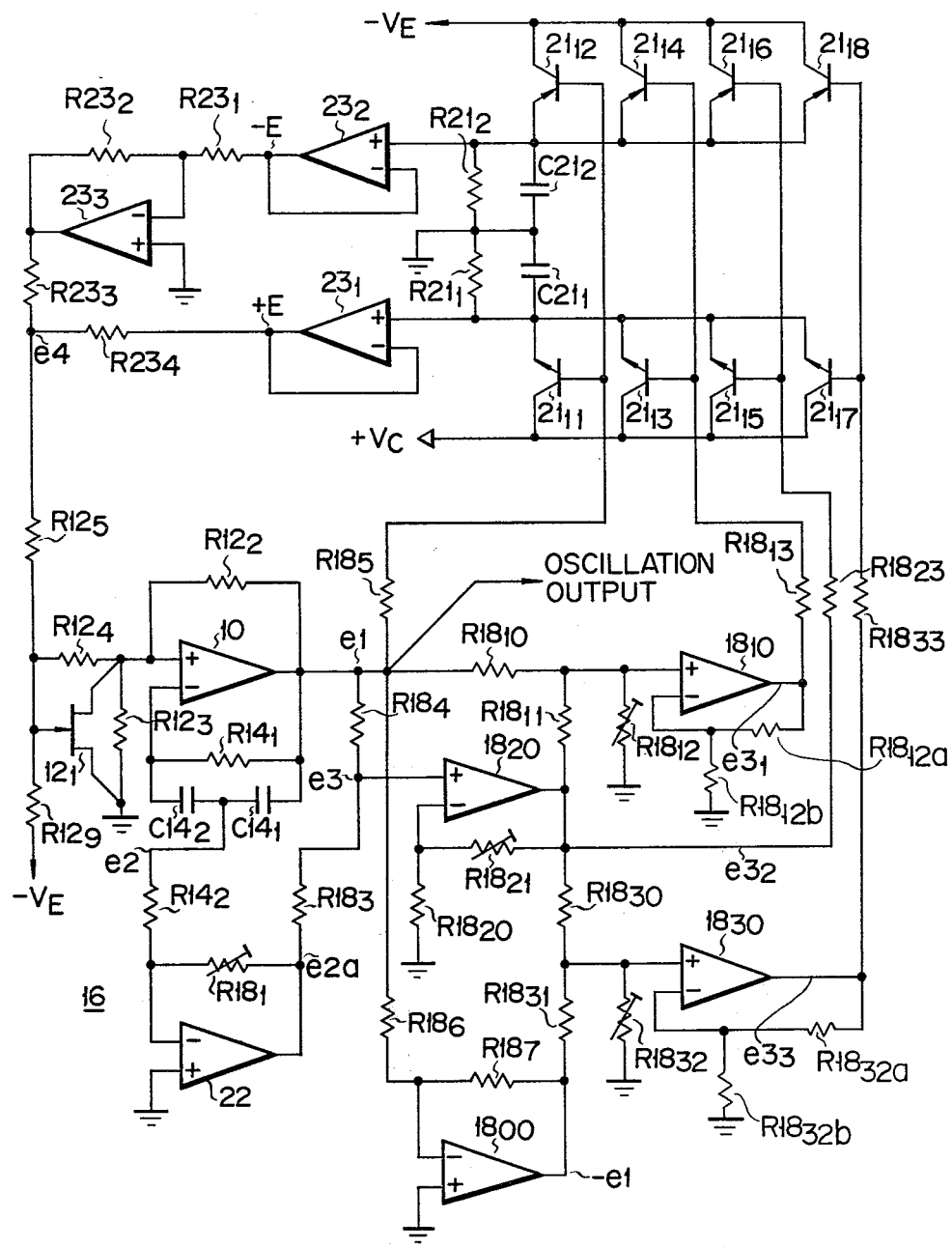
FIG. 15 is an embodied circuit of FIG. 12 configuration.

FIG. 15 shows a sine-wave oscillator which is embodied based on the block configurations of FIGS. 1 and 12. By the circuit configuration of FIG. 15, the signals e1, $e3_1$, $e3_2$ and $e3_3$ as shown in the vector diagram of FIG. 13 can be obtained.

The output of an amplifier 10 is connected to the non-inverted and inverted inputs thereof, via resistors $R12_2$ and $R14_1$. The non-inverted input of the amplifier 10 is grounded through a resistor $R12_3$ and through the drain-source path of a depletion type N channel FET $12_1$. Connected between the gate and drain of the FET $12_1$ is a resistor $R12_4$. For biasing the FET $12_1$ the gate thereof is connected through a resistor $R12_9$ to a negative power source $-V_E$. To the resistor $R14_1$ a series circuit of capacitors $C14_1$ and $C14_2$ is parallel connected. The junction point of the capacitors $C14_1$ and $C14_2$ is connected through a resistor $R14_2$ to the inverted input of an amplifier 22. The non-inverted input of the amplifier 22 is grounded and the inverted input and output thereof are coupled with each other via a resistor $R18_1$. The output of the amplifier 22 is coupled with the output of the amplifier 10, via a series circuit of resistors $R18_3$ and $R18_4$. The oscillation circuit 16 having such configuration is substantially the same as the oscillation circuit 16 shown in FIG. 2. Difference between these oscillation circuits are merely the difference of the device, i.e. used for the impedance controlled element $12_1$ is a photo-coupler or an FET.

The junction point of the resistors $R18_3$ and $R18_4$ is connected to a non-inverted input of an amplifier $18_{20}$. An output of the amplifier $18_{20}$ is connected through a resistor $R18_{21}$ to an inverted input thereof. The inverted input of the amplifier $18_{20}$ is grounded via a resistor $R18_{20}$. Applied to the non-inverted input of the amplifier $18_{20}$ is a phase-shifted signal e3 whose phase is advanced by 90° from the oscillation output signal e1 which is obtained from the output of the amplifier 10. The signal e3 is converted to a signal $e3_2$, whose amplitude is same as that of the signal e1, by amplifying $A_2$ through the amplifier $18_{20}$. The phase of the signal $e3_2$ is advanced by 90° from that of the signal e1. The amplification factor $A_2$ can be adjusted by the resistor $R18_{21}$.

The output of the amplifier 10 and the output of the amplifier $18_{20}$ are connected to a non-inverted input of an amplifier $18_{10}$ through a resistor $R18_{10}$ and a resistor $R18_{11}$, respectively. The non-inverted input of the amplifier $18_{10}$ is grounded via a resistor $R18_{12}$. An inverted input of the amplifier $18_{10}$ is connected to an output thereof, via a resistor $R18_{12a}$. The inverted input of the amplifier $18_{10}$ is grounded through a resistor $R18_{12b}$. The composition of the signals e1 and $e3_2$ is performed at the junction point of the resistors $R18_{10}$ and $R18_{11}$. The amplitude of the composed signal $e1 + e3_2$ can be adjusted by the resistor $R18_{12}$. Suppose that the voltage dividing ratio of the resistors $R18_{10}$, $R18_{11}$ and $R18_{12}$ is $1/\sqrt{2}$ and $R18_{12a} = R18_{12b}$. In this situation a signal $e3_1$ derived from the output of the amplifier $18_{10}$ has the same amplitude as that of the signal e1 and is phase-advanced by 45° from the signal e1.

The output of the amplifier 10 is connected through a resistor $R18_6$ to an inverted input of an amplifier $18_{00}$. Connected between the inverted input and output of the amplifier $18_{00}$ is a resistor $R18_7$. The non-inverted input of the amplifier $18_{00}$ is grounded. In the case where $R18_6 = R18_7$, obtained from the output of the amplifier $18_{00}$ is a signal $-e1$ which has the same amplitude as that of the signal e1 and has an anti-phase relation with the signal e1. The output of the amplifier $18_{20}$ and the output of the amplifier $18_{00}$ are coupled with a noninverted input of an amplifier $18_{30}$ through a resistor $R18_{30}$ and a resistor $R18_{31}$, respectively. The non-inverted input of the amplifier $18_{30}$ is grounded via a resistor $R18_{32}$. An inverted input of the amplifier $18_{30}$ is connected to an output thereof, via a resistor $R18_{32a}$. The inverted input of the amplifier $18_{30}$ is grounded through a resistor $R18_{32b}$. Composition of the signal $e3_2$ and the signal $-e1$ is carried out at the junction point of the resistors $R18_{30}$ and $R18_{31}$. The amplitude of the composed signal $e3_2 - e1$ can be adjusted by the resistor $R18_{32}$. A signal $e3_3$ derived from the output of the amplifier $18_{30}$ having the same amplitude as that of the signal $e1$ is phase-advanced by 135° from the signal $e1$.

The output of the amplifier 10 is connected through a resistor $R18_5$ to the base of an NPN transistor $21_{11}$ and the base of a PNP transistor $21_{12}$. The output of the amplifier $18_{10}$ is connected through a resistor $R18_{13}$ to the base of an NPN transistor $21_{13}$ and the base of a PNP transistor $21_{14}$. The output of the amplifier $18_{20}$ is connected to the bases of NPN transistor $21_{15}$ and PNP transistor $21_{16}$, via a resistor $R18_{23}$. The output of the amplifier $18_{30}$ is connected to the bases of NPN transistor $21_{17}$ and PNP transistor $21_{18}$, via a resistor $R18_{33}$. The collectors of the transistors $21_{11}$, $21_{13}$, $21_{15}$ and $21_{17}$ are connected to a positive power source $+V_C$. The collectors of the transistors $21_{12}$, $21_{14}$, $21_{16}$ and $21_{18}$ are connected to a negative power source $-V_E$. The emitters of the transistors $21_{11}$, $21_{13}$, $21_{15}$ and $21_{17}$ are grounded via a parallel circuit of a capacitor $C21_1$ and a resistor $R21_1$. The emitters of the transistors $21_{12}$, $21_{14}$, $21_{16}$ and $21_{18}$ are grounded through a parallel circuit of a capacitor $C21_2$ and a resistor $R21_2$. The transistors $21_{11}$ to $21_{18}$, capacitors $C21_1$ and $C21_2$, and resistors $R21_1$ and $R21_2$ constitute the absolute peak value detectors $21_0$ to $21_3$. In this configuration the rectifying function between the base-emitter paths of the transistors $21_{11}$ to $21_{18}$ are applied.

In the case where the base-emitter path of bipolar transistor is applied for a signal rectification as mentioned above, the response speed for an amplitude control of the oscillation output signal $e1$ is fast. Because, it can be enlarged an amount of charges per unit time, which charges are supplied to the capacitors $C21_1$ and $C21_2$, by the current-amplification function of the transistors $21_{11}$ to $21_{18}$. That is, if we consider the emitter output impedances of the transistors $21_{11}$ to $21_{18}$ are Re, the capacitors $C21_1$ and $C21_2$ are charged with time constants $C21_1 Re$ and $C21_2 Re$, respectively. While, discharge time constants of these CR circuits are $C21_1 R21_1$ and $C21_2 R21_2$. By such circuit configuration of these CR charge/discharge circuits, a fast response speed and a large discharge time constant can be realized, simultaneously. Derived from the outputs of these CR charge/discharge circuits, or the emitters of the transistors $21_{11}$ and $21_{12}$, are peak potential $+E$ and $-E$ of the signals $e1$, $e3_1$, $e3_2$ and $e3_3$.

The emitter of the transistor $21_{11}$ is connected to a non-inverted input of an amplifier $23_1$. An output of the amplifier $23_1$ is connected to an inverted input thereof. The emitter of the transistor $21_{12}$ is connected to a non-inverted input of an amplifier $23_2$. An output of the amplifier $23_2$ is connected to an inverted input thereof. The output of the amplifier $23_2$ is connected through a resistor $R23_1$ to an inverted input of an amplifier $23_3$. A non-inverted input of the amplifier $23_3$ is grounded. An output of the amplifier $23_3$ is connected to the inverted input thereof via a resistor $R23_2$. When $R23_1 = R23_2$, the amplifier $23_3$ constitutes an inverter with a transfer function of "$-1$". The outputs of the amplifiers $23_3$ and $23_1$ are coupled through a series circuit of resistors $R23_3$ and $R23_4$. The junction point of the resistors $R23_3$ and $R23_4$ is connected to the gate of an FET $12_1$ through a resistor $R12_5$. The junction point of the resistors $R23_3$ and $R23_4$ provides the control signal $e4$. The amplifier $23_1$ to $23_3$ and the resistors $R23_1$ to $R23_4$ constitute the adder 23.

The minimum ripple point of the control signal $e4$ can be obtained by adjusting each of the resistors $R18_1$, $R18_{12}$, $R18_{21}$, $R18_{32}$ and $R23_2$.

Although, a phase-shifting oscillation circuit, which includes cacade-connected CR integrators or CR differentiators of 2-stage or more stage, may be applied for the oscillation circuit 16.

Figure 16:
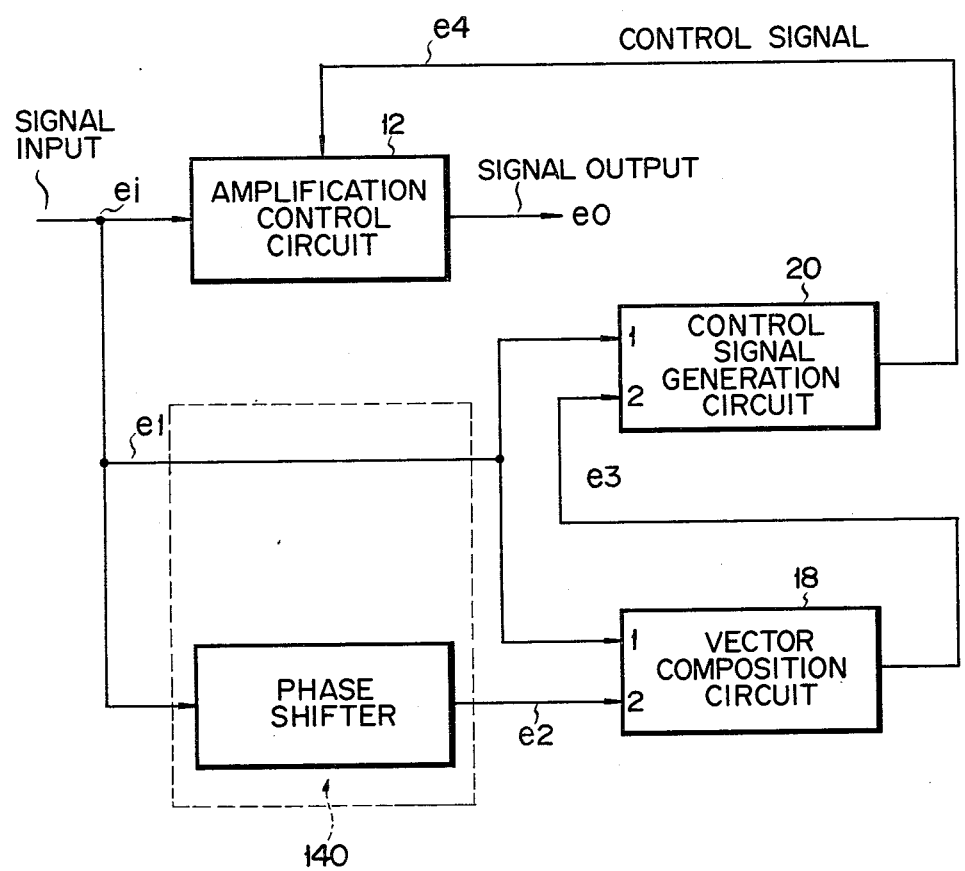
FIG. 16 is a block diagram in which the amplitude control circuit of FIG. 1 is applied to an automatic level control circuit.

FIG. 16 shows a basic configuration of an ALC (Automatic Level Control) circuit or a volume expander circuit, which is an application of this invention. A phase shifter 140 may be conventional one. In the case where the FIG. 16 configuration is embodied the same configuration as the circuit of FIG. 2, a phase shift amount of the shifter 140 is selected to 90°. When the circuit configuration of FIG. 15 is applied, a preferable phase shift amount of the shifter 140 is 45°. When the FIG. 16 configuration is applied for an ALC circuit, a transfer function $G = e_0/e_i$ of the amplitude controlled circuit is small as the amplitude of the input signal $e_i$ is large. On the other hand, this configuration is applied for a volume expander circuit, the transfer function G is large as the amplitude of the signal $e_i$ is large. In the amplitude controlled circuit of FIG. 16, the control signal $e4$ does almost not include ripples even though the operation speed of the control is set to fast. From this, the transfer function G is almost not modulated by the ripple component of the control signal $e4$.

APPLICABLE FIELD OF THE INVENTION

Application of am amplitude control circuit of the invention is suitable for a CR (or LR, LC) type oscillator with an oscillation frequency range below about 1 MHz. Particularly, by using a circuit configuration as shown in FIG. 2, it should be watched that a low-distortion sine-wave generator within extremely low frequency range of about 1 Hz or less can be obtained.

Further, a circuit configuration (18+20) for controlling the amplitude of oscillator according to the invention can be applicable to an ALC (Automatic Level Control) circuit or AGC (Automatic Gain Control) circuit. Thus, to compose a signal whose phase is shifted from the input signal by a conventional phase shifter, the vector composition circuit 18 and the control signal generation circuit 20 shown in FIG. 2 or FIG. 15 may directly be applied to an ALC or AGC circuit. In this case a configuration corresponding to the amplification control circuit 12 corresponds to an attenuator which is level controlled automatically.

What is claimed is:
1. An amplitude controlled sine wave oscillator comprising:
   amplifier means (10) having first and second feedback loops, for providing an oscillation signal (e1);
   amplification control means (12) provided in said first feedback loop, for controlling the gain of said amplifier means (10);
   frequency set means (14) provided in said second feedback loop, for setting a frequency of said oscillation signal (e1) and for providing a first phase-shifted signal (e2) which has a given phase differ- ence from said oscillation signal (e1), the amount of said given phase difference being larger than 0° and less than 180°;

vector composition means (18) coupled to said amplifier means (10) and to said frequency set means (14) for vector-composing from said oscillation signal (e1) and first phase-shifted signal (e2) a second phase-shifted signal (e3) having a 90° phase difference from said oscillation signal (e1); and control means (20) coupled to said amplifier means (10) and to said vector composition means (18) for squaring said oscillation signal (e1) and said second phase-shifted signal (e3), and combining these two squared signals (e1$^2$, e3$^2$) to generate a control signal (e4$a$) which is used for controlling the gain of said amplifier means (10);

characterized in that said control signal means (20) includes filter means (C20$_1$, R20$_{13}$) for reducing ripple components of said control signal (e4$a$) to provide a ripple-less signal (I4), said ripple components containing higher harmonic frequencies of the oscillation frequency of said oscillation signal, and said ripple-less signal (I4) being applied as gain control data to said amplification control means (12) so that the amplitude of said oscillation signal (e1) is kept constant.

2. An amplitude controlled sine wave oscillator comprising:

amplifier means (10) having first and second feedback loops, for providing an oscillation signal (e1);

amplification control means (12) provided in said first feedback loop, for controlling the gain of said amplifier means (10);

frequency set means (14) provided in said second feedback loop, for setting a frequency of said oscillation signal (e1) and for providing a phase-shifted signal (e2) which has a given phase difference from said oscillation signal (e1), the amount of said given phase difference being larger than 0° and less than 180°;

vector composition means (18) coupled to said amplifier means (10) and to said frequency set means (14) for vector-composing from said oscillation signal (e1) and phase-shifted signal (e2) a plurality of polyphase signals (e3$_1$-e3$_3$) each having a given phase difference from said oscillation signal (e1); and control signal means (21+23) coupled to said amplification control means (12) and to said vector composition means (18) for combining said polyphase signals (e3$_1$-e3$_3$) to generate a control signal (e4) which is used for controlling the gain of said amplifier means (10);

characterized in that the wave forms of said polyphase signals (e3$_1$-e3$_3$) are overlapped with one another so that ripples involved in the envelope of said polyphase signals (e3$_1$-e3$_3$) decrease, and that said control signal means (21+23) includes filter means (R21$_1$, R21$_2$, C21$_1$, C21$_2$) for further reducing ripple components of said control signal (e4) to provide a ripple-less signal (I4), said ripple components containing higher harmonic frequencies of the oscillation frequency of said oscillation signal, and said ripple-less signal (I4) being applied as gain control data to said amplification control means (12) so that the amplitude of said oscillation signal (e1) is kept constant.

3. An amplitude controlled sine wave oscillator comprising:

first means (10) having first and second feedback loops, for generating an output signal (e1);

second means (12) provided in said first feedback loop for varying the feedback amount of said first feedback loop;

third means (14) provided in said second feedback loop for determining a frequency of said output signal (e1) and generating a first signal (e2) whose phase is shifted from said output signal (e1) by a given amount;

fourth means (18) coupled to said first and third means (10,14) for composing a second signal (e3) from said output signal (e1) and said first signal (e2), said second signal (e3) being phase-shifted from said output signal (e1) by a predetermined amount;

fifth means (20) coupled to said first and fourth means (10, 18) for composing a third signal (e4$a$) from signals (e1$a$, −e1$a$, e3$a$, −e3$a$) corresponding to said output signal (e1) and said second signal (e3), said third signal (e4$a$) containing higher harmonic frequencies of the oscillation frequency of said output signal and having a DC potential corresponding to the amplitude of said output signal (e1); and sixth means (C20$_1$,R20$_{13}$) coupled to said second and fifth means (12,20) for reducing said higher harmonic frequencies of said third signal (e4$a$) and supplying said second means (12) with a control signal (I4) to vary the feedback amount of said first feedback loop so that the amplitude of said output signal (e1) is kept constant.

4. The oscillator of claim 3 wherein the predetermined amount of phase-shift of said second signal (e3) from said output signal (c$_1$) is substantially 90°; and said fifth means (20) includes means (28-40) coupled to said first and fourth means (10,18) for squaring each of said signals (e1$a$, −e1$a$,e3$a$, −e3$a$) corresponding to said output and second signals (e1,e3) and combining the squared signals (e1$a^2$,e3$a^2$) to generate said third signal (e4$a$).

5. The oscillator of claim 3 wherein said fourth means (18) includes:

means (18$_1$-18$_n$ in FIG. 12 or 18$_{10}$,18$_{20}$, 18$_{30}$, etc. in FIG. 15) responsive to said output and second signals (e1,e3), for generating a plurality of polyphase signals (e3$_1$-e3$_3$) corresponding to said output and second signals (e1,e3) in a manner that the phase of one of said polyphase signals (e3$_1$-e3$_3$) is different from the phase of the other of said polyphase signals; and said fifth means (20) includes:

means (21$_1$-21$_n$ in FIG. 12 or 21$_{13}$-21$_{18}$,23$_1$,23$_2$ in FIG. 15) coupled to said generating means (18$_{10}$-18$_{30}$, etc.) for detecting a peak level of said polyphase signals (e3$_1$-e3$_3$) to provide detected signals (+E,−E) corresponding to said third signal (e4 or e4$a$).

6. The oscillator of claim 3 wherein said first means (10) includes an amplifier (10) having an inverted input terminal (−) and an output terminal, and said third means (14) includes a bridged T circuit which includes:

a series circuit of first and second impedance elements (C14$_1$,C14$_2$) coupled between the inverted input terminal (−) and the output terminal of said amplifier (10);

a third impedance element ($R14_1$) coupled in parallel to the series circuit of said first and second impedance elements ($C14_1, C14_2$); and a fourth impedance element ($R14_2$) coupled between a junction of said first and second impedance elements ($C14_1, C14_2$) and a terminal with substantially zero AC potential, a signal (e2) appearing at the junction of said first and second impedance elements ($C14_1, C14_2$) being utilized as said first signal (e2).

7. The oscillator of claim 3 wherein said first means (10) includes an amplifier (10) having a noninverted input terminal (+) and an output terminal, and said third means (14) includes a Wien-bridge circuit which includes:

a series circuit of first and second impedance elements ($R14_1, C14_1$) coupled between the noninverted input terminal (+) and the output terminal of said amplifier (10); and a parallel circuit of third and fourth impedance elements ($R14_2, C14_2I$) *coupled between the noninverted input terminal (+) of said amplifier (10) and a terminal with a lower AC potential than that at the noninverted input terminal (+) of said amplifier (10), a signal (e2) appearing at the junction of said first and second impedance elements ($R14_1$, $C14_1$) being utilized as* said first signal (e2).

8. The oscillator of claim 3 wherein said first means (10) includes a first amplifier (10) having a noninverted input terminal (+) and an output terminal, and said third means (14) includes:

a series circuit of a first resistor ($R14_1$), a second resistor ($R14_2$) and a first capacitor ($C14_2$), coupled between the noninverted input terminal (+) and the output terminal of said first amplifier (10);

a third resistor ($R14_3$) coupled between the noninverted input terminal (+) of said first amplifier (10) and a terminal with a lower AC potential than that at the noninverted input terminal (+) of said first amplifier (10);

a second amplifier ($14_1$) with a given gain having a noninverted input terminal (+) coupled to the junction of said second resistor and first capacitor, and an output terminal;
and a second capacitor ($C14_1$) coupled between a junction of said first and second resistors ($R14_1, R14_2$) and the output terminal of said second amplifier ($14_1$), a signal (e2) appearing at the output terminal of said second amplifier ($14_1$) corresponding to said first signal (e2).

9. The oscillator of claim 8 wherein the given gain of said second amplifier ($14_1$) is substantially "1", and any of said first and second capacitors ($C14_1, C14_2$) is used for varying the oscillation frequency of said output signal (e1).

10. The oscillator of claim 8 wherein the given gain of said second amplifier ($14_1$) is substantially "1", and said first, second and third resistors ($R14_1$-$R14_3$) are used for varying the oscillation frequency of said output signal (e1), provided that the ratio of:

$$\frac{\text{the sum of the resistances of said first and second resistors}}{\text{the resistance of said third resistor}}$$

(($R14_1+R14_2)/R14_3$) is kept constant.

11. The oscillator of claim 8 wherein the given gain of said second amplifier ($14_1$) is substantially the same as the sum ($C14_2/C14_1+1$) of a ratio ($C14_2/C14_1$) of the capacitance of said first capacitor ($C14_2$) to the capacitance of said second capacitor ($C14_1$) and a constant value "1", and the first resistor ($R14_1$) is used for varying the oscillation frequency of said output signal (e1).

12. The oscillator of claim 3 wherein said fifth means (20) includes:

a first circuit ($R20_1$-$R20_4$, 24) responsive to said output signal (e1) for generating a fourth signal (e1a) and a fifth signal (−e1a) which has an antiphase relation with said fourth signal (e1a);

a second circuit ($R20_5$-$R20_8$, 26) responsive to said second signal (e3) for generating a sixth signal (e3a) and a seventh signal (−e3a) which has an antiphase relation with said sixth signal (e3a);

a first FET (28) having a gate which receives said fourth signal (e1a) and a drain which is supplied with a given potential (−VE);

a second FET (30) having a gate which receives said fifth signal (−e1a) and a drain which is supplied with a given potential (−VE);

a third FET (32) having a gate which receives said sixth signal (e3a) and a drain which is supplied with a given potential (−VE);

a fourth FET (34) having a gate which receives said seventh signal (−e3a) and a drain which is supplied with a given potential (−VE);

a third circuit (36) coupled to sources of said first and second FETs (28,30) for combining source currents of said first and second FETs (28,30) to supply said sixth means ($C20_1$) with a first current which corresponds to the squared value ($e1a^2$) of said fourth and fifth signals (e1a, −e1a); and a fourth circuit (38) coupled to sources of said third and fourth FETs (32,34) for combining source currents of said third and fourth FETs (32,34) to supply said sixth means ($C20_1$) with a second current which corresponds to the squared value ($e3a^2$) of said sixth and seventh signals (e3a, −e3a), the sum of said first and second currents of said third and fourth circuits (36,38) corresponding to said third signal (e4a).

* * * * *